United States Patent
Chuan

(10) Patent No.: US 10,566,918 B1
(45) Date of Patent: Feb. 18, 2020

(54) POWER TOOL MONITORED BY TRACKING A MOTOR CURRENT AND CONTROL METHODS THEREOF

(71) Applicant: KUDOS MECHANICAL CO., LTD., New Taipei (TW)

(72) Inventor: James Chuan, New Taipei (TW)

(73) Assignee: KUDOS MECHANICAL CO., LTD., New Taipei (TW)

(*) Notice: Subject to any disclaimer, the term of this patent is extended or adjusted under 35 U.S.C. 154(b) by 0 days.

(21) Appl. No.: 16/236,073

(22) Filed: Dec. 28, 2018

(51) Int. Cl.
*H02P 6/28* (2016.01)
*G01R 31/34* (2006.01)
*H02K 11/33* (2016.01)
*H02M 5/257* (2006.01)

(52) U.S. Cl.
CPC ........... *H02P 6/28* (2016.02); *G01R 31/34* (2013.01); *H02K 11/33* (2016.01); *H02M 5/2576* (2013.01)

(58) Field of Classification Search
CPC ............................................. H02P 6/28
USPC ................................... 318/700, 34
See application file for complete search history.

(56) References Cited

U.S. PATENT DOCUMENTS 5,495,161 A * 2/1996 Hunter ............ H02P 25/145
318/807

FOREIGN PATENT DOCUMENTS

TW M435520 8/2012

* cited by examiner

*Primary Examiner* — David Luo
(74) *Attorney, Agent, or Firm* — Sinorica, LLC

(57) ABSTRACT

The present invention relates to a power tool monitored by tracking a motor current and control methods thereof. The present invention is mainly about a microprocessor electrically connected to a motor through a drive unit and a current detecting-and-converting module. The microprocessor receives an AC synchronizing signal, and sends a first control signal to the drive unit according to the AC synchronizing signal to drive the motor. The current detecting-and-converting module detects and converts the motor current and output to the microprocessor, thereby the microprocessor detects a per unit time current which is converted into a corresponding pressure value, and then the microprocessor sends a second control signal to the drive unit according to the pressure value to control the operation status of the motor. By detecting and tracking the per unit time current, the purpose of load monitoring and motor protection can be achieved.

15 Claims, 4 Drawing Sheets

POWER TOOL MONITORED BY TRACKING A MOTOR CURRENT AND CONTROL METHODS THEREOF

CROSS REFERENCE TO RELATED APPLICATION(S)

This non-provisional application claims the benefit under 35 U.S.C. § 119(e) to Patent Application No. 201811142948.5 filed in People's Republic of China on Sep. 28, 2018, which is hereby incorporated in its entirety by reference into the present application.

BACKGROUND OF THE INVENTION

1. Field of the Invention

The present invention relates to a power tool and control methods thereof, and especially relates to a power tool which is monitored by tracking a motor current and control methods thereof.

2. Description of the Related Art

In general, a power tool uses a motor as a main driving apparatus to generate kinetic energy. On the other hand, an output specification of a hydraulic tool usually uses a pressure value. Presently, pressure value setting methods mostly use a mechanical pressure relief control or pressure sensors, and the pressure sensors are superior to the mechanical pressure relief control regarding reliability improvement.

For example, Taiwan's utility model patent No. M435520 "Detection device of electro/hydraulic tools" (hereinafter referred to as the cited reference) is provided with a microprocessor, a pressure sensor, a temperature sensor, a battery power sensing circuit, an LED light, and a buzzer warning circuit. By sensing whether the motor temperature, hydraulic cylinder pressure, battery power and so on are normal, the microprocessor will generate a warning when abnormality is detected to remind the user to stop using the tool and to prevent damages.

As can be seen from the above, in the prior art, in order to improve the reliability, pressure sensors were added. For example, in the cited reference, pressure sensors are added to improve reliability and to prevent damages. However, when a pressure sensor is added, the design and space utilization of the power tools become more difficult and the manufacturing costs are also increased. For manufacturers, the miniaturization and the cost down of the power tools are critical issues; hence, better solutions are required to solve the cost and the space utilization problems in the prior art.

SUMMARY OF THE INVENTION

In view of the above deficiencies of the prior art, the main objective of the present invention is to provide a power tool monitored by tracking a motor current and control methods thereof. The present invention utilizes a simplified structure to detect and to track a per unit time motor current to monitor the operation status of the power tool. Thus, the present invention is able to monitor the load and to protect the motor at lower cost and with less space occupied.

The main technical means adopted for achieving the aforementioned objective is a control method that monitors the power tool operation status by detecting and tracking a motor current, and the method comprises the following steps:

Receive an Alternating Current (AC) synchronizing signal, and drive the motor according to the AC synchronizing signal;

Detect a per unit time current and convert the per unit time motor current into a pressure value; and Determine the operation status of the motor according to the pressure value.

According to the aforementioned steps, when the power tool receives the AC synchronizing signal, the power tool will drive the motor according to the AC synchronizing signal. When the power tool detects a per unit time motor current, the per unit time motor current will be converted to a pressure value and depending on the pressure value, the power tool will determine the operation status of the motor to prevent damages by way of detecting and tracking the per unit time motor current so as to achieve the purpose of load monitoring and motor protection.

A major technical means adopted for achieving the aforementioned purpose is to utilize the aforementioned power tool monitored by detecting and tracking a motor current, and the power tool includes:

a motor having an input end and an output end;

a current detecting-and-converting module connected to the output end of the motor;

a drive unit electrically connected to the input end of the motor;

a microprocessor electrically connected to the drive unit and the current detecting-and-converting module;

wherein the microprocessor receives an AC synchronizing signal, and sends a first control signal to the drive unit according to the AC synchronizing signal to drive the motor, and the current detecting-and-converting module detects and converts a motor current to output to the microprocessor, thereby the microprocessor detects a per unit time motor current, wherein the unit time is defined by the received AC synchronizing signal, and then the microprocessor converts the detected per unit time motor current into a corresponding pressure value, and sends a second control signal to the drive unit according to the pressure value to control the operation status of the motor.

Based on the aforementioned structure, the power tool of the present invention comprises the motor, the current detecting-and-converting module, the drive unit, and the microprocessor. When the microprocessor receives the AC synchronizing signal and accordingly drives to start the motor via the drive unit, the current detecting-and-converting module will detect and convert the motor current to output to the microprocessor, and thereby the microprocessor detects a per unit time motor current and converts the per unit time current into a pressure value, wherein the per unit time is defined by the AC synchronizing signal. Finally, the microprocessor controls the operation status of the motor via the control unit based on the pressure value so as to achieve the purpose of load monitoring and motor protection.

DETAILED DESCRIPTION OF THE INVENTION

These and other aspects of the embodiments herein will be better appreciated and understood when considered in conjunction with the following description and the accompanying drawings.

Figure 1:
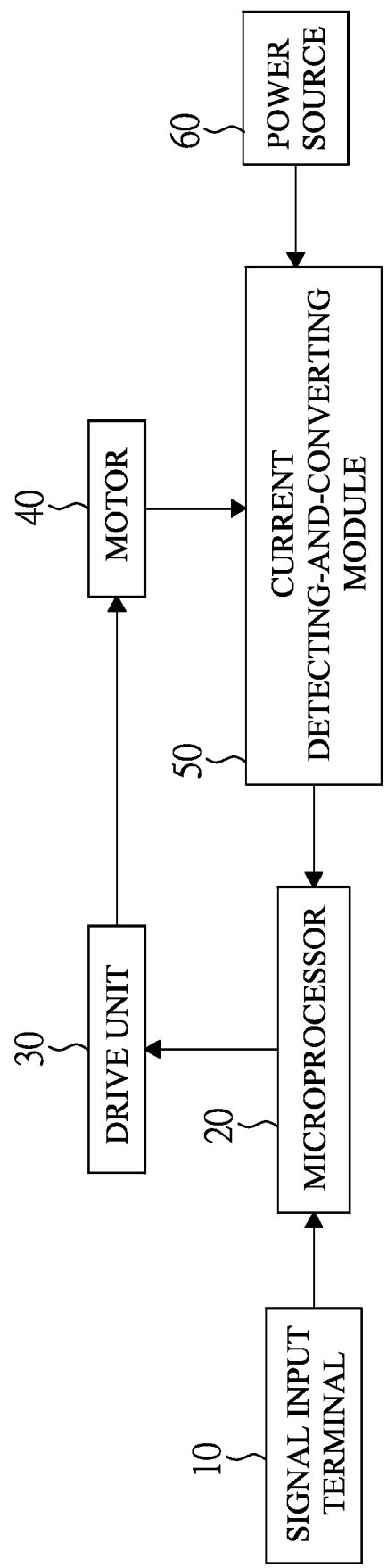
FIG. 1 is a block diagram showing the system architecture of a power tool according to a preferred embodiment of the present invention.

A preferred embodiment of the power tool monitored by tracking a motor current of the present invention, as shown in FIG. 1, includes a signal input terminal 10, a microprocessor 20, a drive unit 30, a motor 40, a current detecting-and-converting module 50, and a power source 60. The microprocessor 20 is electrically connected to the signal input terminal 10, the drive unit 30, and the current detecting-and-converting module 50, respectively. The input end of the motor 40 is connected to the drive unit 30, and the output end of the motor 40 is connected to the current detecting-and-converting module 50. In this preferred embodiment, the current detecting-and-converting module 50 is connected to the power source 60. The power source 60 provides a 5V Direct Current (DC) power; the signal input terminal 10 provides an Alternating Current (AC) synchronizing signal.

The microprocessor 20 receives the AC synchronizing signal from the signal input terminal 10, and sends a first control signal to the drive unit 30 according to the received AC synchronizing signal. After receiving the first control signal, the drive unit 30 sends a first driving signal to the motor 40 to drive the motor 40 to start operation; and the current detecting-and-converting module 50 detects a motor current signal outputted from the motor 40 and converts and amplifies the motor current signal, and then the converted motor current signal is outputted to the microprocessor 20, and thereby the microprocessor 20 detects (for example, by sampling) a per unit time motor current, wherein the unit time is defined by the received AC synchronizing signal (for example, the received AC synchronizing signal defines a sampling period for the microprocessor 20 to do the aforesaid sampling). Afterwards, the microprocessor 20 converts the detected per unit time motor current into a pressure value; finally, when the pressure value reaches a predetermined threshold value, the microprocessor 20 sends a second control signal to the drive unit 30. After receiving the second control signal, the drive unit 30 sends a second driving signal to the motor 40, so that the motor 40 stops working.

Figure 2:
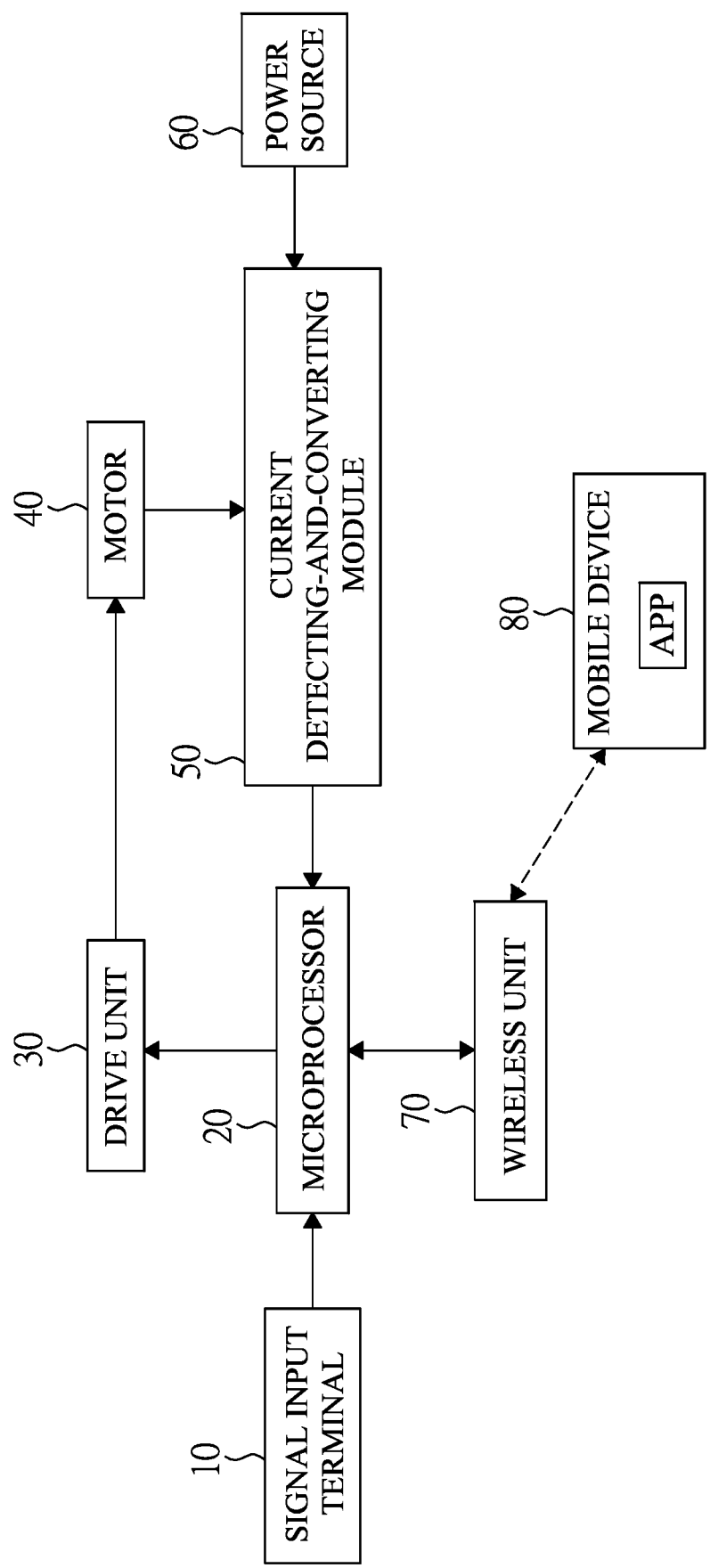
FIG. 2 is another block diagram showing the system architecture of a power tool according to a preferred embodiment of the present invention.

The power tools of the present invention are often operated either in highly hazardous places such as high-altitude, high-pressure places, or under conditions that great destructive force is incurred, such that it will be highly dangerous for users or surrounding personnel; therefore, in a preferred embodiment of the present invention, a wireless remote control operation mode of the power tool is provided. Referring to FIG. 2, the wireless unit 70 is electrically connected to the microprocessor 20. A mobile device 80 with an Application Program (APP) installed thereon can be connected to the wireless unit 70 via a wireless protocol, and the user can operate the APP of the mobile device 80 to wirelessly remote control the ON/OFF of the power tool. The operation status of the motor 40 of the power tool can be transmitted to the mobile device 80, thereby improving the safety of the power tool in highly hazardous places.

In a preferred embodiment, the wireless protocol includes a wireless protocol (such as Frequency Shift Keying (FSK) and so on), a WiFi protocol, a Bluetooth protocol, and a ZigBee protocol.

Figure 3:
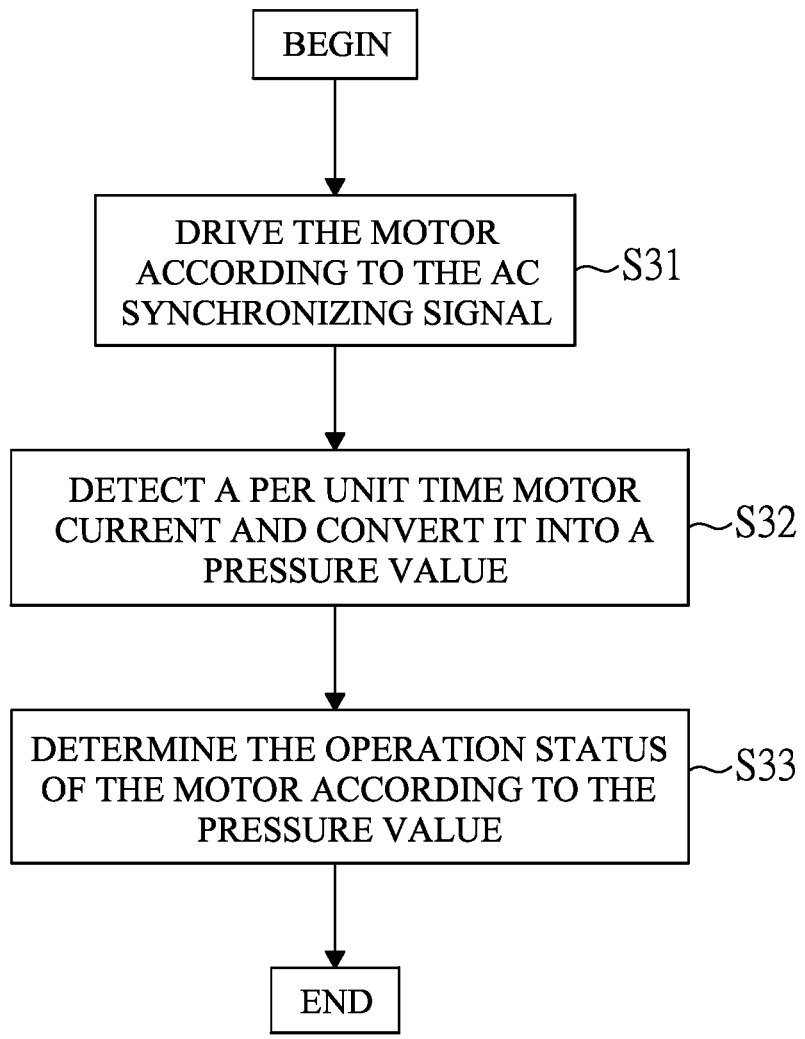
FIG. 3 is a flow chart of a control method of a power tool according to a preferred embodiment of the present invention.
Figure 4:
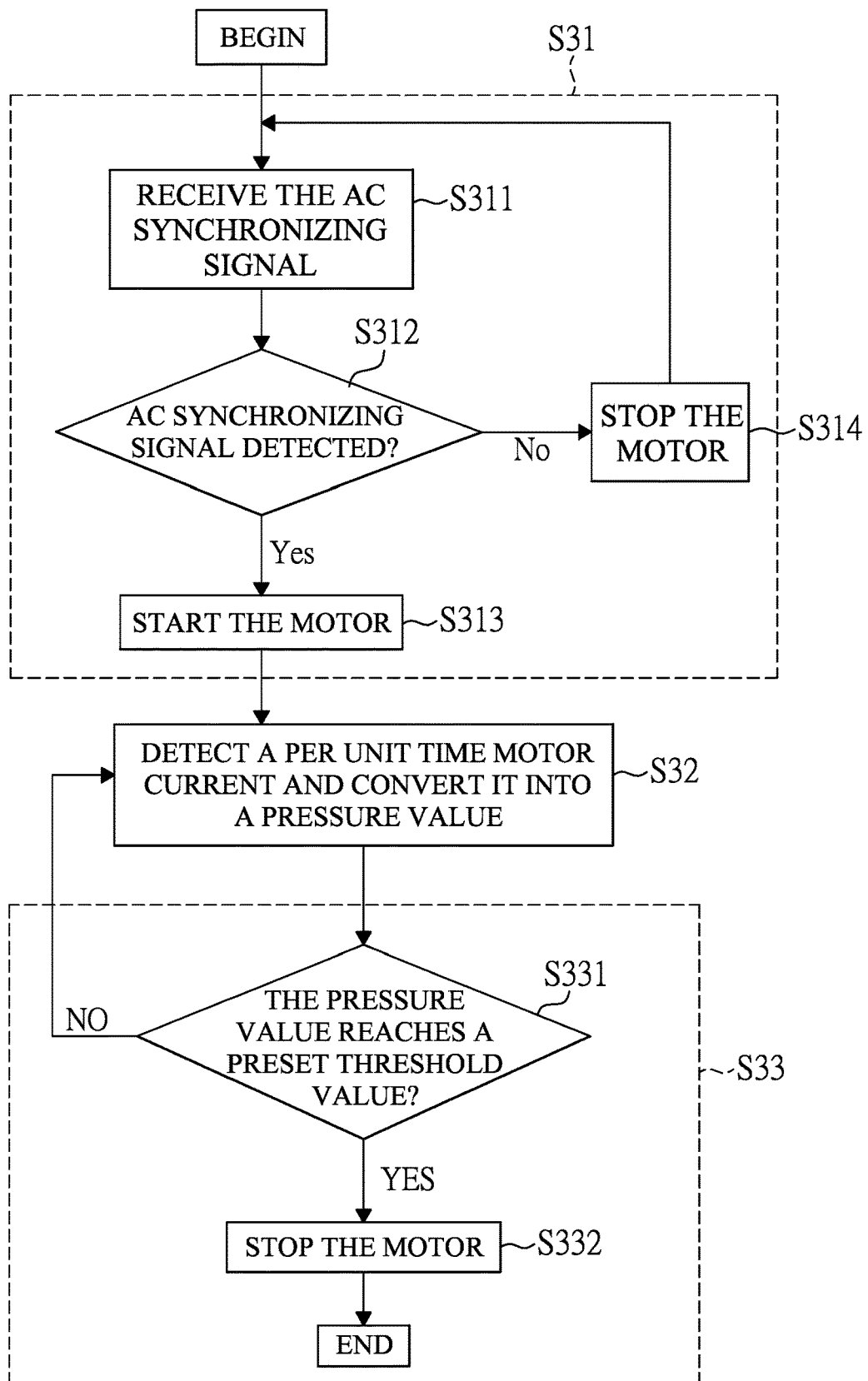
FIG. 4 is another flow chart of a control method of a power tool according to a preferred embodiment of the present invention.

According to the above preferred embodiment and application mode of the present invention, a control method of the power tool that monitors the motor current can be further summarized. As shown in FIG. 3, the method is mainly performed by the microprocessor 20 to execute the following steps:

Receive an AC synchronizing signal, and drive the motor 40 according to the AC synchronizing signal (S31);

Detect a per unit time motor current and convert the per unit time motor current into a pressure value (S32); and Determine the operation status of the motor 40 according to the pressure value (S33).

Moreover, when the foregoing step S31 is performed, the following sub-steps are further included:

Receive the AC synchronizing signal (S311), and

Determine whether the AC synchronizing signal is detected (S312);

If affirmative, then start the motor 40 (S313);

If negative, then stop the motor 40 (S314); and

Receive the AC synchronizing signal (S311).

Further, when the foregoing step S33 is performed, the following sub-steps are further included:

Determine whether the pressure value reaches a preset threshold value (S331);

If affirmative, stop the motor 40 (S332);

If negative, execute the above step S32 "detect a unit-time current and converting the per unit time motor current into a pressure value."

The power tool of the present invention is controlled through monitoring the operation status of the motor 40 without resorting to other pressure sensors, and the purpose of monitoring the load and protecting the motor is achieved at lower cost and with less space occupied.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A control method for a power tool monitored by tracking a motor current, comprising steps of:
   receiving an AC synchronizing signal and driving a motor according to the AC synchronizing signal;
   detecting a per unit time motor current and converting the per unit time motor current into a pressure value; and
   determining an operation status of the motor according to the pressure value.

2. The control method for a power tool monitored by tracking a motor current as claimed in claim 1, wherein the step "receiving an AC synchronizing signal and driving a motor according to the AC synchronizing signal" further includes the following sub-steps:
   receiving the AC synchronizing signal;
   determining whether the AC synchronizing signal is detected; and
   if the AC synchronizing signal is detected, then starting the motor.

3. The control method for a power tool monitored by tracking a motor current as claimed in claim 2, wherein the step "determining whether the AC synchronizing signal is detected" further includes the following sub-steps:
 if the AC synchronizing signal is not detected, then stopping the motor; and
 receiving the AC synchronizing signal.

4. The control method for a power tool monitored by tracking a motor current as claimed in claim 3, wherein the step "determining an operation status of the motor according to the pressure value" further includes the following sub-steps:
 determining whether the pressure value reaches a preset threshold value;
 if the pressure value reaches the preset threshold value, then stopping the motor.

5. The control method for a power tool monitored by tracking a motor current as claimed in claim 4, wherein the step "determining whether the pressure value reaches a preset threshold value" further includes the following sub-steps:
 if the pressure value does not reach the preset threshold value, then executing the above step "detecting a per unit time motor current and converting the per unit time motor current into a pressure value".

6. The control method for a power tool monitored by tracking a motor current as claimed in claim 2, wherein the step "determining an operation status of the motor according to the pressure value" further includes the following sub-steps:
 determining whether the pressure value reaches a preset threshold value;
 if the pressure value reaches the preset threshold value, then stopping the motor.

7. The control method for a power tool monitored by tracking a motor current as claimed in claim 6, wherein the step "determining whether the pressure value reaches a preset threshold value" further includes the following sub-steps:
 if the pressure value does not reach the preset threshold value, then executing the step "detecting a per unit time motor current and converting the per unit time motor current into a pressure value".

8. The control method for a power tool monitored by tracking a motor current as claimed in claim 1, wherein the step "determining an operation status of the motor according to the pressure value" further includes the following sub-steps:
 determining whether the pressure value reaches a preset threshold value;
 if the pressure value reaches the preset threshold value, then stopping the motor.

9. The control method for a power tool monitored by tracking a motor current as claimed in claim 8, wherein the step "determining whether the pressure value reaches a preset threshold value" further includes the following sub-steps:
 if the pressure value does not reach the preset threshold value, then executing the step "detecting a per unit time motor current and converting the per unit time motor current into a pressure value".

10. A power tool monitored by tracking a motor current, comprising:
 a motor having an input end and an output end;
 a current detecting-and-converting module connected to the output end of the motor;
 a drive unit electrically connected to the input end of the motor;
 a microprocessor electrically connected to the drive unit and the current detecting-and-converting module;
 wherein the microprocessor receives an AC synchronizing signal, and sends a first control signal to the drive unit according to the AC synchronizing signal to drive the motor, and the current detecting-and-converting module detects a motor current and converts the motor current and then outputs the converted motor current to the microprocessor, and thereby the microprocessor detects a per unit time motor current, wherein the unit time is defined by the received AC synchronizing signal, and then the microprocessor converts the detected per unit time motor current into a pressure value, and sends a second control signal to the drive unit according to the pressure value to control the motor.

11. The power tool monitored by tracking a motor current, as claimed in claim 10, wherein when the pressure value reaches a predetermined threshold value, the microprocessor sends the second control signal to the drive unit, and after receiving the second control signal, the drive unit sends a second driving signal to the motor to stop the motor.

12. The power tool monitored by tracking a motor current, as claimed in claim 11, further comprising a wireless unit electrically connected to the microprocessor; and
 the wireless unit connected to a mobile device with an APP installed thereon via a wireless protocol.

13. The power tool monitored by tracking a motor current as claimed in claim 12, wherein the wireless protocol further comprises a FSK wireless protocol, a WiFi protocol, a Bluetooth protocol, or a ZigBee protocol.

14. The power tool monitored by tracking a motor current, as claimed in claim 10, further comprising a wireless unit electrically connected to the microprocessor; and
 the wireless unit connected to a mobile device with an APP installed thereon via a wireless protocol.

15. The power tool monitored by tracking a motor current as claimed in claim 14, wherein the wireless protocol further comprises a Frequency-Shift Keying (FSK) wireless protocol, a WiFi protocol, a Bluetooth protocol, or a ZigBee protocol.

* * * * *